US012700832B2

(12) United States Patent
Chan et al.

(10) Patent No.: US 12,700,832 B2
(45) Date of Patent: Aug. 4, 2026

(54) COMPACT AND BROADBAND DOHERTY POWER AMPLIFIER

(71) Applicant: City University of Hong kong, Kowloon (HK)

(72) Inventors: Wing Shing Chan, Kowloon (HK); Liheng Zhou, Jiangsu (CN); Xinyu Zhou, Kowloon (HK)

(73) Assignee: City University of Hong Kong, Kowloon (HK)

( * ) Notice: Subject to any disclaimer, the term of this patent is extended or adjusted under 35 U.S.C. 154(b) by 478 days.

(21) Appl. No.: 18/203,323

(22) Filed: May 30, 2023

(65) Prior Publication Data

US 2024/0405727 A1 Dec. 5, 2024

(51) Int. Cl.
*H03F 1/02* (2006.01)
*H03F 1/42* (2006.01)
*H03F 1/56* (2006.01)
*H03F 3/21* (2006.01)

(52) U.S. Cl.
CPC ............. *H03F 1/0288* (2013.01); *H03F 1/42* (2013.01); *H03F 1/565* (2013.01); *H03F 3/211* (2013.01); *H03F 2200/387* (2013.01)

(58) Field of Classification Search
None
See application file for complete search history.

(56) References Cited

U.S. PATENT DOCUMENTS 9,531,325 B2 12/2016 Yu et al.
10,033,335 B1 7/2018 Chan et al.

10,063,190 B2 8/2018 Pham et al.
10,511,265 B2 12/2019 Ai et al.
10,833,634 B2 11/2020 Chan et al.
10,972,053 B2 4/2021 Dani et al.
11,043,920 B2 6/2021 Chan et al.
11,070,173 B2 7/2021 Kori et al.

(Continued)

OTHER PUBLICATIONS

H. C. Chang, Y. Hahn, P. Roblin, and T. W. Barton, "New mixed-mode design methodology for high-efficiency outphasing chireix amplifiers," IEEE Trans. Circuits Syst. I, Reg. Papers, vol. 66, No. 4, pp. 1594-1607, Apr. 2019.

(Continued)

*Primary Examiner* — Andrea Lindgren Baltzell
*Assistant Examiner* — Malane Lieng
(74) *Attorney, Agent, or Firm* — Renner, Kenner, Greive, Bobak, Taylor & Weber

(57) ABSTRACT

A Doherty power amplifier that includes an input, an output, a main power amplification device connected between the input and the output; and an auxiliary power amplification device connected between the input and the output. The auxiliary power amplification device is arranged in parallel with the main power amplification device. The Doherty power amplifier further includes a first dual-mode impedance transformer connected between the main power amplification device and the output, and a second dual-mode impedance transformer between the auxiliary power amplification device and the output. The first and second dual-mode ITs each is adapted to convert an input impedance of a corresponding one of the main and auxiliary power amplification devices to a load impedance at the output, at two frequencies simultaneously.

13 Claims, 12 Drawing Sheets

(56) References Cited

U.S. PATENT DOCUMENTS

| | | | |
|---|---|---|---|
| 11,201,592 B2 * | 12/2021 | Ahn | ..................... H03F 1/3288 |
| 11,201,593 B2 | 12/2021 | Khlat | |
| 11,239,869 B2 | 2/2022 | Wang | |
| 11,245,363 B2 | 2/2022 | Bouisse | |
| 11,283,474 B2 | 3/2022 | Shen | |
| 2024/0162862 A1 * | 5/2024 | Scatamacchia | ........... H03F 1/56 |

OTHER PUBLICATIONS

H. Zhang, R.-Z. Zhan, Y. C. Li, and J. Mou, "High efficiency Doherty power amplifier using dual-adaptive biases," IEEE Trans. Circuits Syst. I, Reg. Papers, vol. 67, No. 8, pp. 2625-2634, Aug. 2020.

J. Kim et al., "Highly efficient RF transmitter over broad average power range using multilevel envelope-tracking power amplifier," IEEE Trans. Circuits Syst. I, Reg. Papers, vol. 62, No. 6, pp. 1648-1657, Jun. 2015.

A. Mamdouh, M. Aboudina, F. Hussien, and A. N. Mohieldin, "Efficient supply modulator for wide-band envelope elimination and restoration power amplifiers," IEEE Trans. Circuits Syst. II, Express Briefs, vol. 67, No. 1, pp. 9-13, Jan. 2020.

H. Taghavi, M. H. Akbarpour, and F. M. Ghannouchi, "Sequential load-pull technique for multioctave design of RF power amplifiers," IEEE Trans. Circuits Syst. II, Exp. Briefs, vol. 63, No. 9, pp. 818-822, Sep. 2016.

X. Y. Zhou et al., "Broadband Doherty-like power amplifier using paralleled right- and left-handed impedance transformers," IEEE Trans. Microw. Theory Techn., vol. 68, No. 11, pp. 4599-4610, Nov. 2020.

J. Pang et al., "A post-matching Doherty power amplifier employing low-order impedance inverters for broadband applications," IEEE Trans. Microw. Theory Techn., vol. 63, No. 12, pp. 4061-4071, Dec. 2015.

J. Xia, M. Yang, Y. Guo, and A. Zhu, "A broadband high-efficiency Doherty power amplifier with integrated compensating reactance," IEEE Trans. Microw. Theory Techn., vol. 64, No. 7, pp. 2014-2024, Jul. 2016.

R. Darraji, D. Bhaskar, T. Sharma, M. Helaoui, P. Mousavi, and F. M. Ghannouchi, "Generalized theory and design methodology of wideband Doherty amplifiers applied to the realization of an octave-bandwidth prototype," IEEE Trans. Microw. Theory Techn., vol. 65, No. 8, pp. 3014-3023, Aug. 2017.

J. J. M. Rubio, V. Camarchia, M. Pirola, and R. Quaglia, "Design of an 87% fractional bandwidth Doherty power amplifier supported by a simplified bandwidth estimation method," IEEE Trans. Microw. Theory Techn., vol. 66, No. 3, pp. 1319-1327, Mar. 2018.

X. Y. Zhou et al., "A mixed topology for broadband high-efficiency Doherty power amplifier," IEEE Trans. Microw. Theory Techn., vol. 67, No. 3, pp. 1050-1064, Mar. 2019.

M. Li, J. Pang, Y. Li, and A. Zhu, "Bandwidth enhancement of Doherty a power amplifier using modified load modulation network," IEEE Trans. Circuits Syst. I, Reg. Papers, vol. 67, No. 6, pp. 1824-1834, Jun. 2020.

W. Shi et al., "Design and analysis of continuous-mode Doherty power amplifier with second harmonic control," IEEE Trans. Circuits Syst. II, Exp. Briefs, vol. 68, No. 7, pp. 2247-2251, Jul. 2021.

D. Gustafsson, J. C. Cahuana, D. Kuylenstierna, I. Angelov, N. Rorsman, and C. Fager, "A wideband and compact GaN MMIC Doherty amplifier for microwave link applications," IEEE Trans. Microw. Theory Techn., vol. 61, No. 2, pp. 922-930, Feb. 2013.

M. Akbarpour, M. Helaoui, and F. M. Ghannouchi, "A transformer-less load-modulated (TLLM) architecture for efficient wideband power amplifiers," IEEE Trans. Microw. Theory Techn., vol. 60, No. 9, pp. 2863-2874, Sep. 2012.

M. N. A. Abadi, H. Golestaneh, H. Sarbishaei, and S. Boumaiza, "An extended bandwidth Doherty power amplifier using a novel output combiner," in IEEE MTT-S Int. Microw. Symp. Dig., Jun. 2014.

X. Zhou et al: IEEE Transactions on Circuits and Systems—I: Regular Papers, vol. 67, No. 6, Jun. 2020; Linearity Enhanced Harmonic-Modulated Impedance Inverter Doherty-Like Power Amplifier.

M. Roberg er al: IEEE Transactions on Microwave Theory and Techniques, vol. 59, No. 8, Aug. 2011, Analysis of High-Efficiency Power Amplifiers With Arbitrary Output Harmonic Terminations.

X. Zhou et al: IEEE Transactions on Circuits and Systems—I: Regular Papers 1, A Doherty Power Amplifier With Extended High-Efficiency Range Using Three-Port Harmonic Injection Network.

* cited by examiner

Solid--w/o drain bias
Dashed--with drain bias $2f_n$

| Ref. | [7] | [8] | [9] | [10] | [11] | [12] | [13] | [15] | [16] | T.W. |
|---|---|---|---|---|---|---|---|---|---|---|
| GaN Device | 2×30W | 2×13W | 2×13W | 2×13W | 2×13W | 2×13W | 2×13W | 2×13W | 13+30W | 2×13W |
| Freq (GHz) | 1.7-2.6 | 1.7-2.8 | 0.55-1.1 | 1.5-3.8 | 1.4-2.1 | 2.8-3.55 | 1.1-2.4 | 1.95-2.45 | 0.7-0.95 | 2.1-3.1 |
| BW (GHz) | 0.9 | 1.1 | 0.45 | 2.3 | 0.7 | 0.75 | 1.3 | 0.5 | 0.25 | 1 |
| $P_{(dBm)}$ | 44.6-46.3 | 44-44.5 | 42-43.5 | 42.3-43.4 | 42.8-43.5 | 43-45 | 43-44.4 | 39.8-41.8 | 43 | 42.2-43.3 |
| F-n@6-dB OBO? | 56.9-69 | 61.2-67.3 | 38.1-49.5 | 42-70 | 69-74.7 | 66.5-80.6 | 58-72.4 | 48-51.1² | 48-56 | 56.2-66 |
| η@Sat. | 69-79.8 | 70-86.9 | 53.3-68.6 | 53.5-80.3 | 74.7-97.7 | 87.8-103.7 | 73.4-90.6 | 58.4-73.2² | 49-65 | 76.7-86 |
| Gain at Sat. | 8-10.2 | 11.6-12.1 | 10.2-14.3 | 5-8 | 7-9 | 6.5-8 | 7-8 | 11.4-15.1 | 12.1-15.4 | 7-8.2 |
| PMN Size ($\lambda_g \times \lambda_g$) | Y 1.43×0.95 | Y 1.6×2.1 | Y N.A. | Y 1.47×1.76 | Y 0.94×1.25 | Y 1×1.16 | Y 0.84×1.3 | N N.A. | N N.A. | N 0.89×0.65 |

Fig. 14

COMPACT AND BROADBAND DOHERTY POWER AMPLIFIER

FIELD OF INVENTION

This invention relates to power amplifiers and in particular to Doherty power amplifiers used in RF (Radio Frequency)/Microwave/Wireless systems.

BACKGROUND OF INVENTION

High-order modulation format signals with multiple sub-channels have demonstrated their practicality in modern wireless communications, but there are still challenges due to their high peak-to-average power ratio (PAPR). These practical challenges lie mainly in the power amplifiers, to not only maximize output power and efficiency at saturation, but also to maximize efficiency at output power back-off (OBO). A variety of techniques have been developed to mitigate degradation in performance with high PAPR, for example outphasing power amplifier (PA) [1], Doherty power amplifier (DPA) [2], envelope tracking [3], envelope elimination and restoration [4], and sequential PA [5]. Among them, Doherty power amplifiers (DPAs) have been widely adopted in modern base-stations due to their simplicity and ruggedness. However, although ever-evolving mobile communication standards require a broadband design, DPA's bandwidth is limited by its drain-source capacitance (Cds), offset line and impedance transformer (IT) [6]. An output matching network (OMN) with high conversion is desirable in the classic DPA but the conversion ratio is inversely proportional to bandwidth. Post-matching networks (PMNs) are commonly used to broaden the bandwidth of DPAs, where the impedance conversion is moved to the rear of summing node [7]-[13]. PMNs based on lowpass impedance matching network, are usually comprised of multi-section stepped-impedance lines or shunt stubs. This inevitably occupies a large area and subsequent higher loss, which are especially noticeable at high frequency or in on-chip designs.

Modern wireless transmitters are evolving into ever dense, distributed small-cell base stations, requiring for more compact DPAs. Some techniques have tried to broaden DPA's bandwidths without the use of PMNs. In [14], Cds was absorbed into the IT to increase the MMIC DPA bandwidth. In [15], the OMNs were elaborately designed with no need of an IT and offset line thus eliminating its bandwidth limitation. In [16], an LC tank was placed in parallel at the summing node to form a new combiner that extends the bandwidth. However, their bandwidths are significantly smaller than for the PMN scheme.

REFERENCES

Each of the following references (and associated appendices and/or supplements) is expressly incorporated herein by reference in its entirety:

[1] H. C. Chang, Y. Hahn, P. Roblin, and T. W. Barton, "New mixed-mode design methodology for high-efficiency outphasing chireix amplifiers," IEEE Trans. Circuits Syst. I, Reg. Papers, vol. 66, no. 4, pp. 1594-1607, April 2019.

[2] H. Zhang, R. Z. Zhan, Y. C, Li, and J. Mou, "High efficiency Doherty power amplifier using dual-adaptive biases," IEEE Trans. Circuits Syst. I, Reg. Papers, vol. 67, no. 8, pp. 2625-2634 August 2020.

[3.] J. Kim et al., "Highly efficient RF transmitter over broad average power range using multilevel envelope-tracking power amplifier," IEEE Trans. Circuits Syst. I, Reg. Papers, vol. 62, no. 6, pp. 1648-1657 June 2015.

[4] A. Mamdouh, M. Aboudina, F. Hussien, and A. N. Mohieldin, "Efficient supply modulator for wide-band envelope elimination and restoration power amplifiers," IEEE Trans. Circuits Syst. II, Express Briefs, vol. 67, no. 1, pp. 9-13, January 2020.

[5] H. Taghavi, M. H. Akbarpour, and F. M, Ghannouchi, "Sequential load-pull technique for multioctave design of RF power amplifiers," IEEE Trans. Circuits Syst. II, Exp. Briefs, vol. 63, no. 9, pp. 818-822, September 2016.

[6] X. Y. Zhou et al., "Broadband Doherty-like power amplifier using paralleled right- and left-handed impedance transformers," IEEE Trans. Microw. Theory Techn., vol. 68, no. 11, pp. 4599-4610, November 2020.

[7] J. Pang et al., "A post-matching Doherty power amplifier employing low-order impedance inverters for broadband applications," IEEE Trans. Microw. Theory Techn., vol. 63, no. 12, pp. 4061-4071 December 2015.

[8] J. Xia, M. Yang, Y. Guo, and A. Zhu, "A broadband high-efficiency Doherty power amplifier with integrated compensating reactance," IEEE Trans. Microw. Theory Techn., vol, 64, no. 7, pp. 2014-2024, July 2016.

[9] R. Darraji, D. Bhaskar, T. Sharma, M. Helaoui, P. Mousavi, and F. M. Ghannouchi, "Generalized theory and design methodology of wideband Doherty amplifiers applied to the realization of an octave-bandwidth prototype," IEEE Trans. Microw. Theory Techn., vol. 65, no. 8, pp. 3014-3023 August 2017.

[10] J. J. M. Rubio, V. Camarchia, M. Pirola, and R. Quaglia, "Design of an 87% fractional bandwidth Doherty power amplifier supported by a simplified bandwidth estimation method," IEEE Trans. Microw. Theory Techn., vol, 66, no. 3, pp. 1319-1327 March 2018.

[11] X. Y. Zhou et al., "A mixed topology for broadband high-efficiency Doherty power amplifier," IEEE Trans. Microw. Theory Techn., vol. 67, no. 3, pp. 1050-1064 March 2019.

[12] M. Li, J. Pang, Y. Li, and A. Zhu, "Bandwidth enhancement of Doherty a power amplifier using modified load modulation network," IEEE Trans. Circuits Syst. I, Reg. Papers, vol. 67, no. 6, pp. 1824-1834 June, 2020.

[13] W. Shi et al., "Design and analysis of continuous-mode Doherty power amplifier with second harmonic control," IEEE Trans. Circuits Syst. II, Exp. Briefs, vol. 68, no. 7, pp. 2247-2251 July 2021.

[14] D. Gustafsson, J. C. Cahuana, D. Kuylenstierna, I. Angelov, N. Rorsman, and C. Fager, "A wideband and compact GaN MMIC Doherty amplifier for microwave link applications," IEEE Trans. Microw. Theory Techn., vol, 61, no. 2, pp. 922-930. February 2013.

[15] M. Akbarpour, M. Helaoui, and F. M. Ghannouchi, "A transformer-less load-modulated (TLLM) architecture for efficient wideband power amplifiers," IEEE Trans. Microw. Theory Techn., vol. 60, no. 9, pp. 2863-2874 September 2012.

[16] M. N. A. Abadi, H. Golestaneh, H. Sarbishaei, and S. Boumaiza, "An extended bandwidth Doherty power amplifier using a novel output combiner," in IEEE MTT-S Int. Microw. Symp. Dig., June 2014.

SUMMARY OF INVENTION

Accordingly, the invention in one aspect provides a Doherty power amplifier that includes an input, an output, a main power amplification device connected between the input and the output; and an auxiliary power amplification device connected between the input and the output. The auxiliary power amplification device is arranged in parallel with the main power amplification device. The Doherty power amplifier further includes a first dual-mode IT connected between the main power amplification device and the output, and a second dual-mode IT between the auxiliary power amplification device and the output. The first and second dual-mode ITs each is adapted to convert a load-pull impedance of a corresponding one of the main and auxiliary power amplification devices to a load impedance at the output, at two frequencies simultaneously.

In some embodiments, each of the first and second dual-mode ITs collaborates with a drain bias that is connected to an output of a corresponding one of the main and auxiliary power amplification devices.

In some embodiments, the drain biases each have a length which is smaller than $\lambda/4$ at $f_0$ to increase the ratio of impedance conversion.

In some embodiments, each of the first and second dual-mode ITs can be equivalent to a first inductor, a third inductor, and a shunt LC tank which includes paralleled second inductor and capacitor. The first inductor has a first end connected to an output of a corresponding one of the main and auxiliary power amplification devices. A second end of the first inductor is connected to a first end of the shunt LC tank and to a first end of the third inductor. A second end of the shunt LC tank is grounded. A second end of the third inductor is connected to the output of the Doherty power amplifier.

In some embodiments, each of the first inductor and third inductor is realized by a section of transmission line. The LC tank is realized by a short-ended stub.

In some embodiments, each of the first and second dual-mode ITs has a short-ended stub. The two short-ended stubs are placed adjacently to form a couple-line filter which defines an out-of-phase second harmonic injection path.

In some embodiments, the Doherty power amplifier further contains first stepped-impedance lines connected between the wideband coupler and the main power amplification device, and second stepped-impedance lines connected between the wideband coupler and the auxiliary power amplification device.

In some embodiments, the Doherty power amplifier further contains a third dual-mode IT connected between the first dual-mode IT and the Output of the Doherty power amplifier, and a fourth dual-mode IT connected between the second dual-mode IT and the output of the Doherty power amplifier. The first and third dual-mode ITs form a two-order cascaded structure in the carrier path; the second and fourth dual-mode ITs form a two-order cascaded structure in the peaking path.

In some embodiments, each of the third and fourth dual-mode ITs comprises a shunt stub.

In some embodiments, the shunt stubs of the third and fourth dual-mode ITs form a couple-line bandpass filter.

In some embodiments, the broadband Doherty power amplifier is free of a post-matching network.

Embodiments of the invention thus provide compact and broadband DPAs, for example a small-size DPA without post-matching network is presented while a harmonic injection network is constructed without additional circuit to improve performance at high edge operating frequency. In comparison, traditional broadband DPAs are commonly based on post-matching networks which occupy large areas. The DPAs provided by embodiments of the invention result in the size, loss and cost of circuit for base station transmitter to be significantly reduced in future wireless communication systems, and they can be reproduced based on other transistors and operating frequency ranges. In addition, the DPAs are based on dual-mode ITs, which may be replaced by an equivalent LC circuit that is convenient when transferring to on-chip designs.

BRIEF DESCRIPTION OF FIGURES

The foregoing and further features of the present invention will be apparent from the following description of embodiments which are provided by way of example only in connection with the accompanying FIGURES, of which:

FIG. 14 is a table of comparisons of performance of the Doherty power amplifier in FIG. 8 as compared to some conventional power amplifiers.

DETAILED DESCRIPTION

Figure 1:
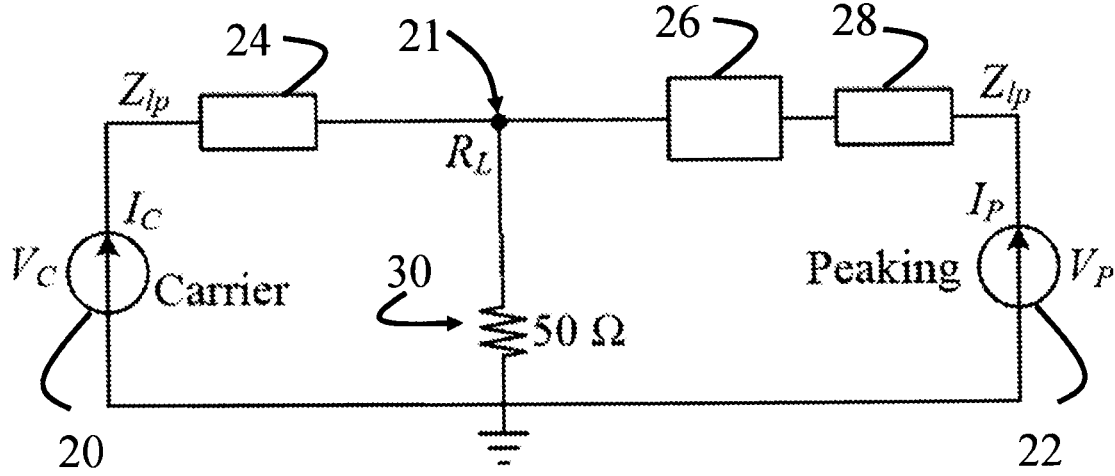
FIG. 1 is a general schematic diagram of a Doherty power amplifier according to one embodiment of the invention.

FIG. 1 shows a schematic diagram of a broadband Doherty power amplifier according to a first embodiment of the invention. It should be noted that there is no specific circuit implementation illustrated in FIG. 1, because there are more than one possible implementations for the DPA in FIG. 1, examples of which will be described in detail later. There are two parallel amplifier paths in the DPA, and two power amplification devices are located respectively on the two paths, as understood by those skilled in the art. In particular, in a carrier path there is a main power amplification device 20 that operates in class B mode, and in a peaking path there is an auxiliary power amplification device 22 that operates in class C mode. The two power amplification devices 20, 22 are illustrated as two voltage-controlled current sources in FIG. 1, but skilled persons will understand that in actual circuits the power amplification devices may include amplifier elements (e.g., transistors), a RF input, input impedance matching circuits, etc., all of which are not illustrated in FIG. 1.

The output of the main power amplification device 20 connects to a first dual-mode IT 24, which serves as an OMN in the carrier path. Similarly, the output of the auxiliary power amplification device 22 connects to a second dual-mode IT 28, which serves as an OMN in the peaking path. In addition, there is an offset line 26 connected between a summing node 21 of the DPA and the second dual-mode IT 28, in order to produce a high impedance toward the auxiliary power amplification device 22 when it is off. The summing node 21 as understood by skilled person is at the location where a main amplifier current $I_C$ from the main power amplification device 20 and an auxiliary amplifier current $I_P$ from the auxiliary power amplification device 22 are combined, and the load at the summing node 21 is represented by an output load 30 which in the example of FIG. 1 has a value of 50 Ohm. The output load 30 has a first end connected to the summing node 21, and a second end which is grounded.

One can see that in the DPA of FIG. 1, there is no PMN, which would have appeared between the summing node and the output load in case of conventional DPAs. Instead, the first dual-mode IT 24 in the carrier path converts the load-pull impedance $Z_{lp}$ of the main power amplification device 20 to a loading impedance $R_L$ at OBO, and $2R_L$ at saturation. The second dual-mode IT 28 together with the offset line 26 in the peaking path converts the load-pull impedance $Z_{lp}$ of the auxiliary power amplification device 22 to infinity at OBO, and $2R_L$ at saturation. As such, a PMN is not needed in the DPA of FIG. 1 if $R_L$ is made equal to 50 Ohm (i.e., if $R_L$ is made the same as the output load 30).

Figure 2:
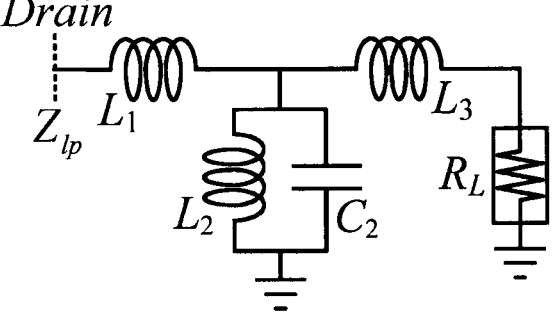
FIG. 2 shows an equivalent LC circuit of the dual-mode ITs in FIG. 1.

Next, details of the first dual-mode IT 24 and the second dual-mode IT 28, including their design principles and operational principles, will be described. The first dual-mode IT 24 is adapted to convert an input impedance (i.e., the load-pull impedance at the output of the main power amplification device 20) to a load impedance at the output of the first dual-mode IT 24, at two frequencies simultaneously. Similarly, the second dual-mode IT 28 is adapted to convert an input impedance (i.e., the load-pull impedance at the output of the auxiliary power amplification device 22) to a load impedance at the output of the second dual-mode IT 28, at two frequencies simultaneously. FIG. 2 shows an equivalent L-C circuit of each of the first dual-mode IT 24 and the second dual-mode IT 28, in which the input impedance is expected to be the load-pull impedances $Z_{lp}$ in FIG. 1. One can see that in the OMN represented in FIG. 2 for the first dual-mode IT 24 and the second dual-mode IT 28, there are a first inductor $L_1$, a third inductor $L_3$, as well as a shunt stub formed by a second inductor $L_2$ that is in parallel connection with a capacitor $C_2$. The loading impedance $R_L$ at the output of the OMN (as it is at the summing node 21 in FIG. 1) is also shown in FIG. 2. The first inductor $L_1$ has a first end connected to the output of a corresponding one of the main and auxiliary power amplification devices 20, 22. A second end of the first inductor $L_1$ is connected to a first end of the shunt stub (i.e., first ends of the second inductor $L_2$ and the capacitor $C_2$), and also to a first end of the third inductor $L_3$. A second end of the shunt stub (i.e., second ends of the second inductor $L_2$ and the capacitor $C_2$) is grounded. A second end of the third inductor $L_3$ is connected to the summing node 21 and also the output of the DPA.

Based on the LC circuit in FIG. 2, the input impedance $Z_{lp}$ of the OMN can be represented using Eq. (1) as shown below, where the jw axis is used to represent the imaginary part of the frequency response of the LC circuit.

$$Z_{lp} = jwL_1 + \cfrac{1}{jwC_2 + 1/jwL_2 + 1/(R_L + jwL_3)} \tag{1}$$

If $L_3$ is small and negligible, the real and imaginary parts of $Z_{lp}$ can be simplified to $$R_{lp} = \frac{R_L w^2 L_2^2}{R_L^2 \left(1 - w^2 C_2 L_2\right)^2 + w^2 L_2^2} \tag{2}$$

$$X_{lp} = wL_1 + \frac{wL_2 R_L^2 \left(1 - w^2 C_2 L_2\right)}{R_L^2 \left(1 - w^2 C_2 L_2\right)^2 + w^2 L_2^2} \tag{3}$$

$L_1$ in the LC circuit can be used to tune $X_{lp}$ independently, while $R_{lp}$ is simultaneously converted to $R_L$ and $2R_L$ respectively at OBO and saturation.

$$\frac{R_L w^2 L_1^2}{R_L^2 \left(1 - w^2 C_1 L_1\right)^2 + w^2 L_1^2} = \frac{2R_L w^2 L_1^2}{4R_L^2 \left(1 - w^2 C_1 L_1\right)^2 + w^2 L_1^2} \tag{4}$$

There are two positive solutions for Eq. (4) which can be given as $$w_1 = \frac{L_1 + \sqrt{L_1^2 + 8R_L^2 L_1 C_1}}{2\sqrt{2}\,R_L L_1 C_1} \quad w_2 = \frac{-L_1 + \sqrt{L_1^2 + 8R_L^2 L_1 C_1}}{2\sqrt{2}\,R_L L_1 C_1} \tag{5}$$

For the first dual-mode IT 24 and the second dual-mode IT 28, $R_{lp}$ can realize the expected conversion at two frequencies. Substituting Eq. (5) into Eq. (2), it results in a conversion ratio of 1.5 ($1.5R_{lp}$=$R_L$). The relationship between normalized $L_2$ and $C_2$ can be obtained after normalizing $R_L$ to 1 and normalizing the frequency $w_1+w_2$=2.

$$\overline{L}_2^2 + 8\overline{L}_2\overline{C}_2 = 8\overline{L}_2^2\overline{C}_2^2 \tag{6}$$

Two groups of $\overline{L}_2$ and $\overline{C}_2$ are selected based on Eq. (6) and the normalized $Z_{lp}$ can be plotted as a function of normalized frequency, as shown in FIGS. 3$a$ and 3$b$. It can be seen that the solid and dashed lines have two intersection points, verifying Eq. (5). In other words, the dual-mode IT structure shown in FIG. 2 can work as an OMN at the frequency bands near these two points. For an inductive LC tank, they approach each other to form a broadband design with a bandwidth of $\sim\Delta w$. However, a limitation can be observed that there is a crest at $\overline{w}\approx1$, here $\overline{R}_{lp}\approx1$. This gives rise to a low conversion ratio that prevents the drain voltage from reaching its maximum value, thus degrading efficiency and output power.

Figure 3A:
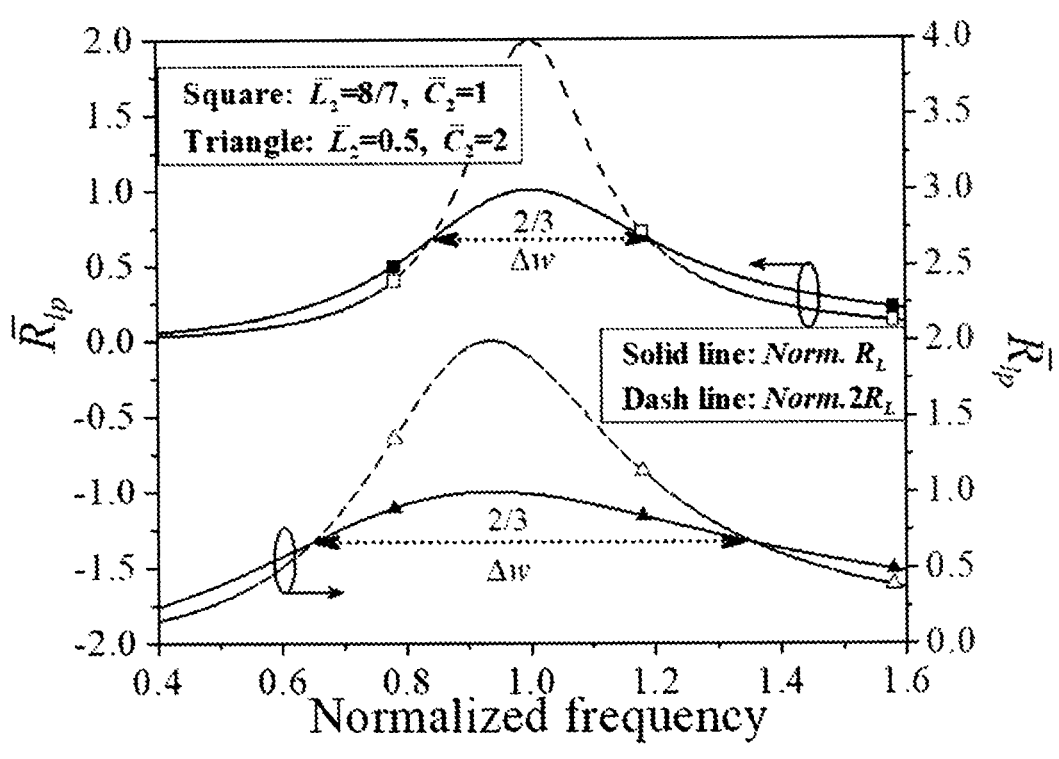
FIG. 3a plots a real part of a normalized $Z_{lp}$ as a function of normalized frequency for the LC circuit in FIG. 2, with different L-C parameters.
Figure 3B:
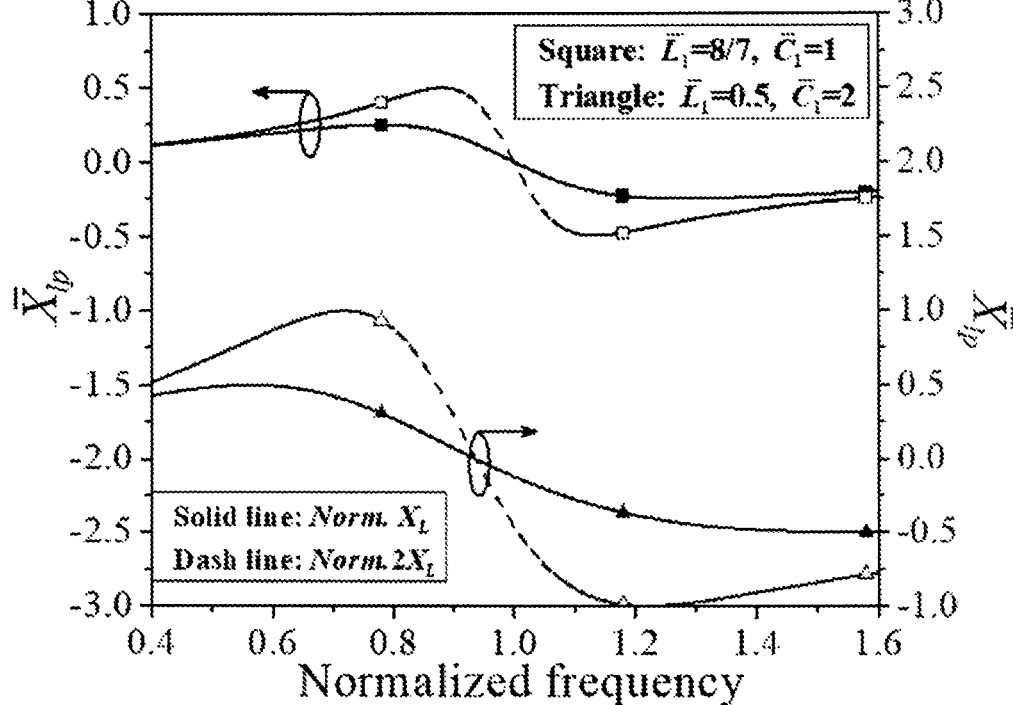
FIG. 3b plots an imaginary part of the normalized $Z_{lp}$ as a function of the normalized frequency for the LC circuit in FIG. 2, with different L-C parameters.

$X_{lp}$, monotonically decreases within the range of $\sim\Delta w$, as shown in FIG. 3b. This matches the feature of a power amplifier design because there are numerous parasitic capacitances in a transistor which becomes more pronounced as frequency increases. Meanwhile, the fluctuation of $\overline{X}_{lp}$, is smaller for an inductive tank, which can cater to the needs of a broadband PA.

Figures 4, 5A:
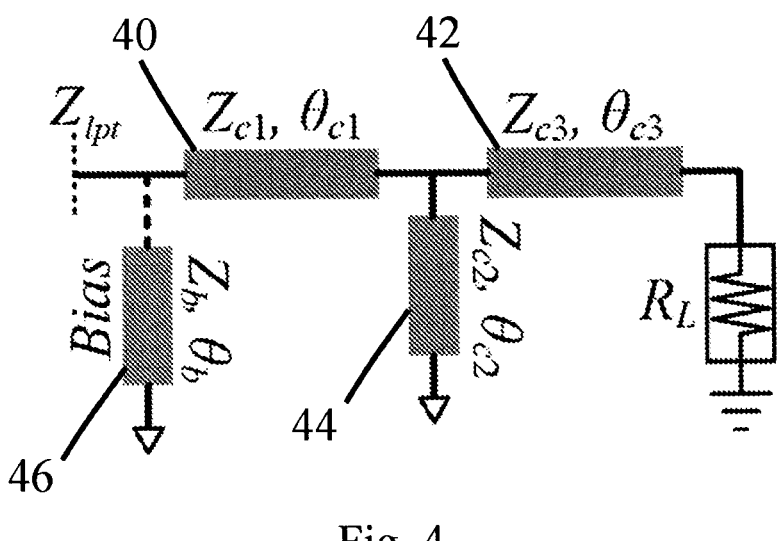
FIG. 4 shows a microstrip implementation of a dual-mode IT with a short drain bias, according to another embodiment of the invention.
FIG. 5a depicts a comparative illustration of $S_{21}$ of a microstrip IT with and without a shunt short-ended stub as shown in FIG. 4.

Turning to FIG. 4, which shows one exemplary microstrip transmission-line implementation of the dual-mode IT structure shown in FIG. 2. In FIG. 4, a first line segment 40 having a characteristic impedance of $Z_{c1}$ and an electrical length $\theta_{c1}$ corresponds to the first inductor $L_1$ in FIG. 2. A second line segment 42 having a characteristic impedance of $Z_{c3}$ and an electrical length $\theta_{c3}$ corresponds to the second inductor $L_3$ in FIG. 2. A third line segment 44 having a characteristic impedance of $Z_{c2}$ and an electrical length $\theta_{c2}$ corresponds to the stunt stub consisting of the second inductor $L_2$ and the capacitor $C_2$ in FIG. 2. In addition, FIG. 4 shows a short drain bias stub 46 which has a characteristic impedance of $Z_b$ and an electrical length $\theta_b$.

Assume that the short drain bias stub 46 does not exist, then the ABCD matrix of the microstrip IT shown in FIG. 4 is given by $$\begin{pmatrix} A & B \\ C & D \end{pmatrix} = \quad (7)$$

$$\begin{pmatrix} \cos\theta_1 & jZ_1\sin\theta_1 \\ jY_1\sin\theta_1 & \cos\theta_1 \end{pmatrix}\begin{pmatrix} 1 & 0 \\ 1/(jZ_2\tan\theta_2) & 1 \end{pmatrix}\begin{pmatrix} \cos\theta_3 & jZ_3\sin\theta_3 \\ jY_3\sin\theta_3 & \cos\theta_3 \end{pmatrix}\begin{pmatrix} 1 & R_L \\ 0 & 1 \end{pmatrix}$$

$S_{21}$ of the OMN can be solved based on Eq. (7). The expression for input impedance $Z_{lpt}$ in FIG. 4 can also be easily obtained. The performance of the microstrip IT can be better presented by an intuitive example rather than by cumbersome algebraic calculations. Since $L_3$ in FIG. 2 is negligible, both $Z_{c3}$ and $\theta_{c3}$ in FIG. 4 are small. The inductive LC tank is realized by the shunt stub 44 with a large $Z_{c2}$ which is short-ended. $Z_{c1}$ and $\theta_{c1}$ can be tuned for impedance matching and subsequent harmonic injection. The example exhibits a bandstop response, as shown in FIG. 5a, Besides being part of the dual-mode IT, the shunt stub 44 can create a notch located at $2f_n$. Therefore, if a PA based on this dual-mode IT works at $f_n$, its second harmonic generated by the nonlinearity of the transistor will be suppressed.

Figure 5B:
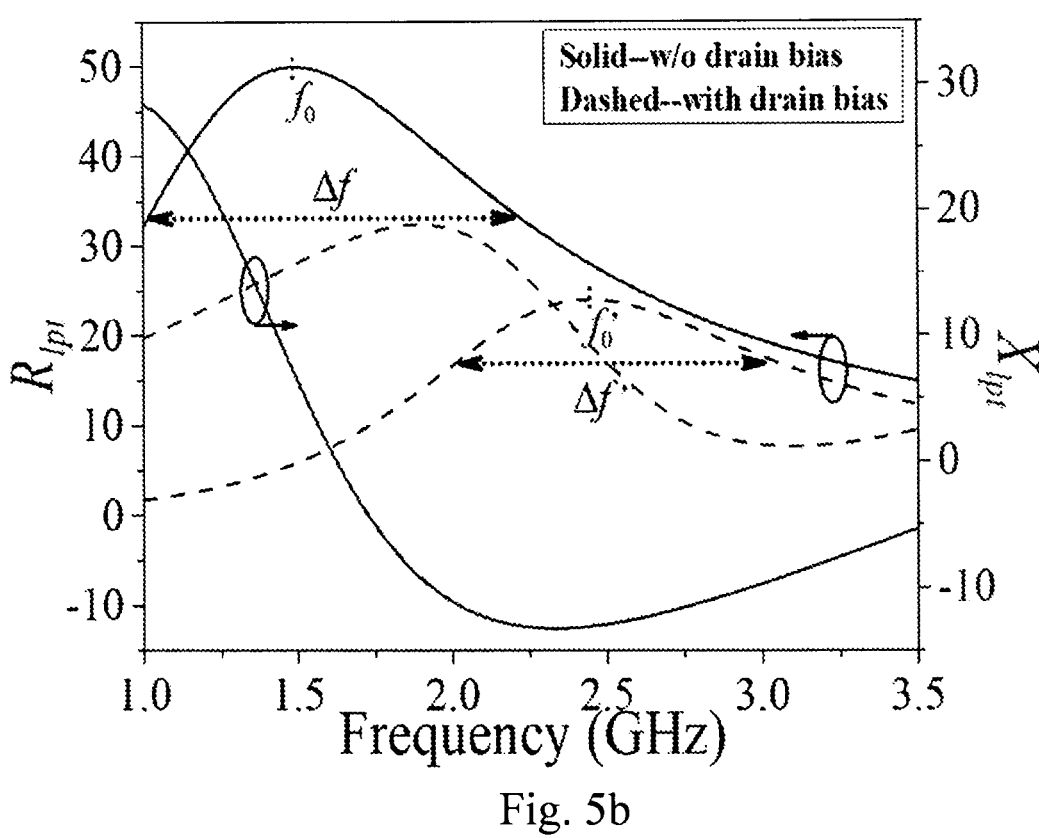
FIG. 5b shows the normalized $Z_{lp}$ of the microstrip IT as a function of the normalized frequency, with and without a shunt short-ended stub of FIG. 4.

FIG. 5b shows the characteristics of $Z_{lpt}$, which are very similar to that of $\overline{Z}_{lp}$ in FIGS. 3a-3b. The dotted lines represent the conversion ratio of 1.5 ($2MaxR_{lpt}/3$). Like the analysis in FIG. 3a, the DPA is expected to work in the range of $\Delta f$, where $R_{lpt}$ exhibits a parabolic-type shape with $X_{lpt}$ dropping continuously. For the solid line, the peak with $R_{lpt}\approx R_L$ implies a degradation at center frequency $f_0$, while losses are large within the range of $\Delta f$ as shown in FIG. 5a, thus decreasing the PA's efficiency.

The above discussions assume that the short drain bias stub 46 does not exist. Next, the discussions will be moved to the actual circuit in FIG. 4 where the short drain bias stub 46 is present, which is usually set to be $\lambda/4$ (lambda quarter) at $f_0$ to eliminate its impact on the OMN. However, the length $\theta_b$ of the short drain bias stub 46 is shortened to improve $Z_{lpt}$, as shown in the dashed line of FIG. 5b. Obviously, $f_0$ is shifted up to $f_0'$ while $R_{lpt}$ and $X_{lpt}$ have smaller fluctuations which are beneficial to a broadband PA design. More importantly, the whole conversion ratio is significantly increased after reducing $\theta_b$. At peak, $R_{lpt}$ decreases from $\sim50$ to $24\Omega$ after adding the short drain bias stub 46, therefore doubling the conversion ratio. The inherent limitation of the dual-mode IT is improved as a result. As shown in FIG. 5a, the short drain bias stub 46 has negligible impact on $S_{21}$ except at the low edge frequencies while $f_0'$ aligns roughly with the point of minimal loss. The dual-mode IT together with the short drain bias stub 46 as shown in FIG. 4 is therefore a good candidate for broadband DPA.

The fundamental waveform of a PA can be reshaped for performance enhancement by injecting an external signal at its harmonics, at the cost of a more complex circuit with an additional signal source. DPA topology has innately two paths as mentioned in the beginning, which facilitates self generated harmonic injection. This requires an OMN which can reject harmonics and also as a bridge to guide harmonics between the two paths. Similarly, this bridge also needs to block the fundamental frequency. For a DPA based on the OMN shown in FIG. 4, it is able to exploit the existing structure to realize such an injection bridge without any additional paths.

Figure 6:
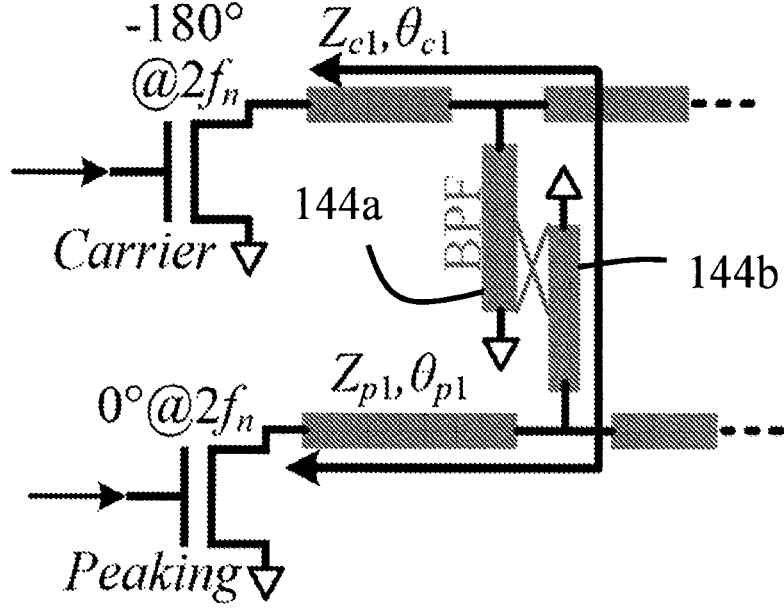
FIG. 6 shows microstrip implementations of the two dual-mode ITs, which form a couple-line filter, according to another embodiment of the invention.
Figure 7:
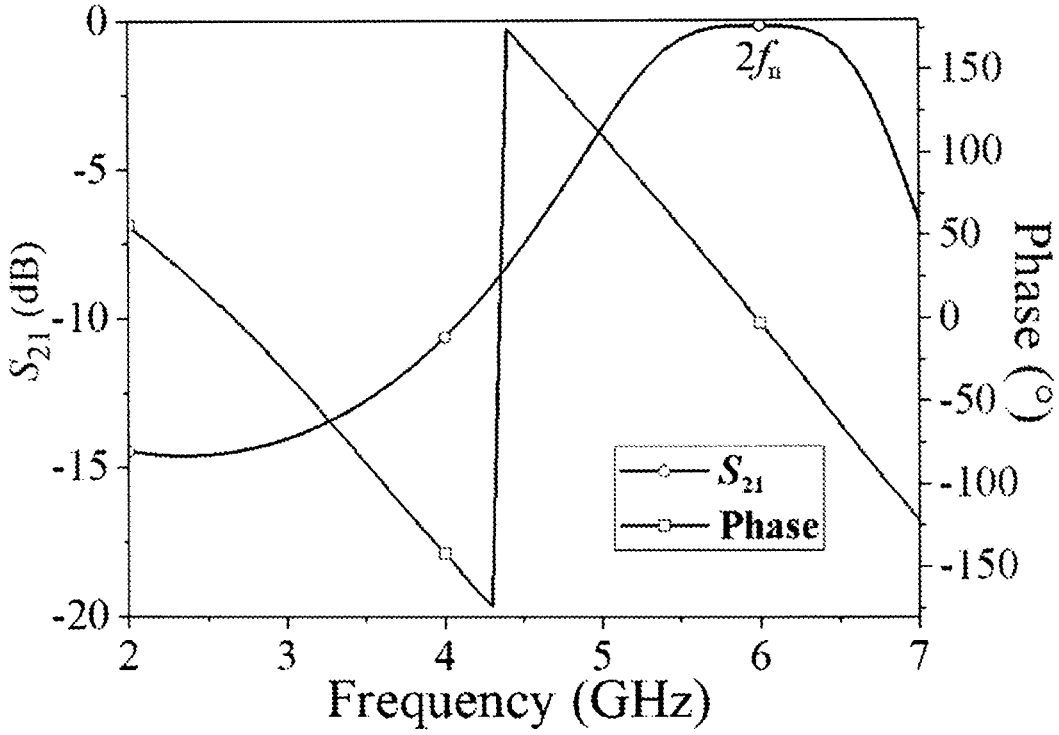
FIG. 7 shows the phase and $S_{21}$ changes as a function of frequency for the couple-line bandpass filter formed by two shunt stubs in FIG. 6.

The second harmonic will be rejected due to the shunt stub 44 if the DPA based on the dual-mode IT in FIG. 4 operates $f_n$. According to another embodiment of the invention as shown in FIG. 6, the two shunt stubs 144a, 144b that respectively belong to OMNs on the carrier and peaking paths are used to construct a couple-line bandpass filter, as shown in FIG. 6, which allows $2f_n$ pass and suppresses $f_n$ ($S_{21}<-13$ dB), as shown in FIG. 7. Each of the OMNs has a structure similar to that in FIG. 4, so they will not be described in detail again, but note that there is no short drain bias stub shown in FIG. 6. A wideband coupler (not shown) is used to split the input signal, and thus the phase difference of drains between the two paths is about 90° at $f_n$ (180° at $2f_n$). The phase of the injection path marked by the double-arrow line in FIG. 6 is designed to be $\sim0°$ at $2f_n$ by adjusting $\theta_{c1}$ and $\theta_{p1}$, resulting in an out-of-phase injection. It is worth noting that the injection must be narrow band due to the strict phase requirement, and is optimal at saturation as this is where the transistor in the auxiliary amplifier produces a large amount of harmonics.

Figure 8:
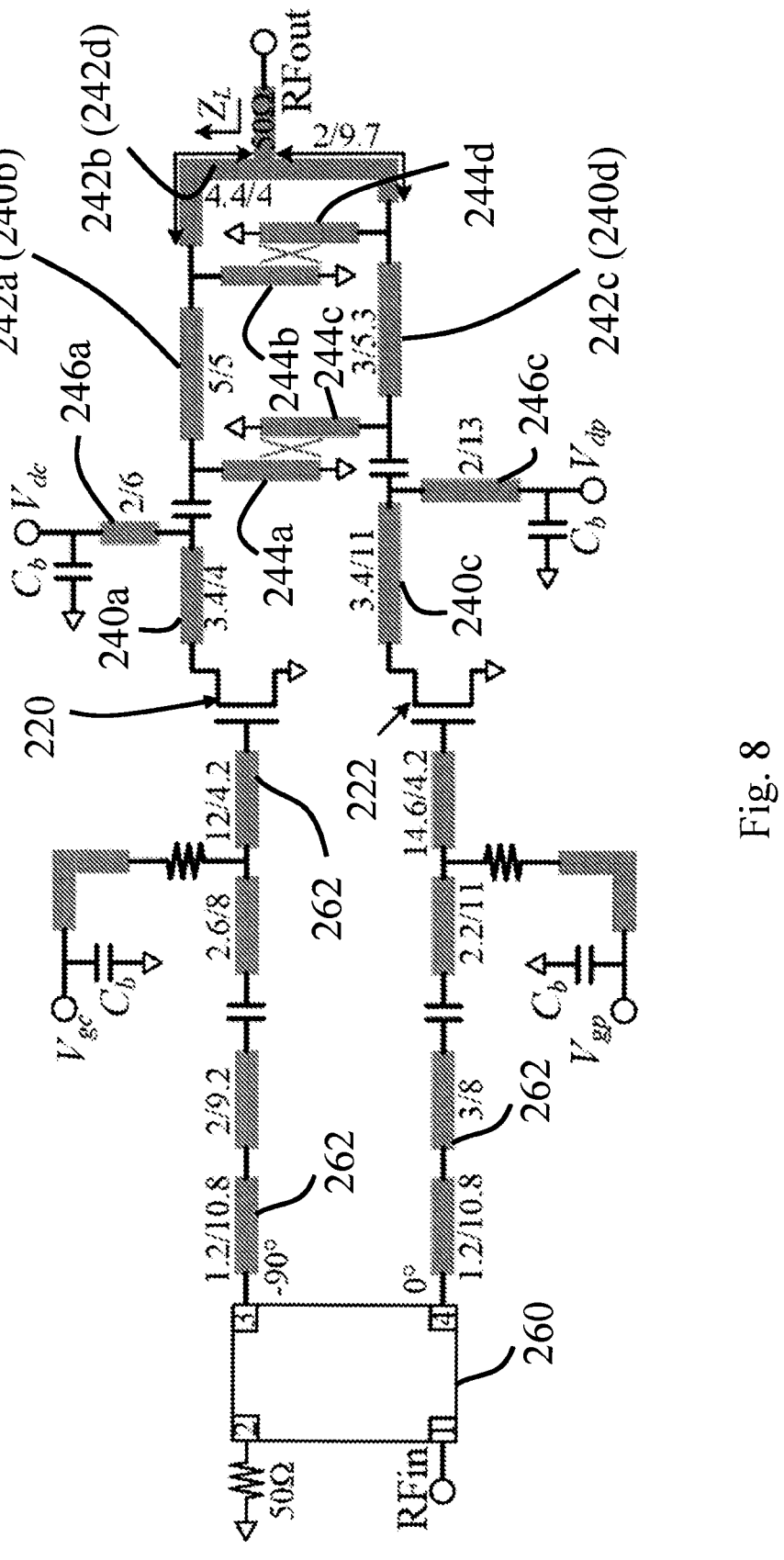
FIG. 8 shows a microstrip implementation of a Doherty power amplifier, according to another embodiment of the invention.

Turning to FIG. 8, a microstrip implementation of a Doherty power amplifier according to another embodiment of the invention has the high-level schematic structure as shown in FIG. 1, but it also incorporates the short drain bias stub in FIG. 4, and also the couple-line bandpass filter in FIG. 6. In the DPA shown in FIG. 8, there is a transistor 220 which acts as the main amplifier in the carrier path, and also there is a transistor 222 which acts as the auxiliary amplifier on the peaking path. The source of both transistors 220, 222 are grounded, while their drains are connected respectively to OMNs in the carrier path and the peaking path. Gates of the transistors 220, 222 are connected to respective input matching network in the carrier path and the peaking path, where the input matching networks are connected to a wideband coupler 260. The wideband coupler 260 is connected to an input of the DPA which is indicated as "RFin" in FIG. 8. The wideband coupler 260 has the functions of both a power divider and a phase shifter, as it is required to maintain the phase offset of 90° (as shown in FIG. 8) between the two amplifiers. In one example, the wideband coupler 260 is a commercial wideband coupler 11306-3S from Anaren™. The transistors 220, 222 are Cree™ CGH40010F GaN HEMT (High Electron Mobility Transistor). Each of the input matching network contains a plurality of stepped impendence lines 262, and is used for controlling the gain flatness over the intended frequency range.

The OMNs in each of the carrier path and the peaking path has a basic unit design as that shown in FIG. 4, but note that on each path there is a two-order cascaded structure, that two similar dual-mode ITs are cascaded on each path which help extend the bandwidth of the notch. In particular, in the carrier path a first dual-mode IT has a short drain bias stub 246a, a first inductor 240a, a third inductor 242a, and a shunt stub 244a. A second dual-mode IT on the same path has a first inductor 240b, a third inductor 242b, and a shunt stub 244b, but it does not have a short drain bias. The first inductor 240b is fabricated on the same segment line as the third inductor 242a. On the peaking path a third dual-mode IT has a short drain bias stub 246c, a first inductor 240c, a third inductor 242c, and a shunt stub 244c. A fourth dual-mode IT on the same path has a first inductor 240d, a third inductor 242d, and a shunt stub 244d, but it does not have a short drain bias. The first inductor 240d is fabricated on the same segment line as the second inductor 242c. Also, it can be seen from FIG. 8 that the shunt subs 244a, 244c of the first and third dual-mode ITs form a couple-line bandpass filter, and similarly the shunt subs 244b, 244d of the second and fourth dual-mode ITs form a couple-line bandpass filter. The third inductor 242b of the second IT, and the third inductor 242d of the fourth IT, are fabricated on the same segment line, which also contains the output load that has a value of 50 Ohm. The output of the DPA is indicated as "RFout" in FIG. 8.

Figure 9:
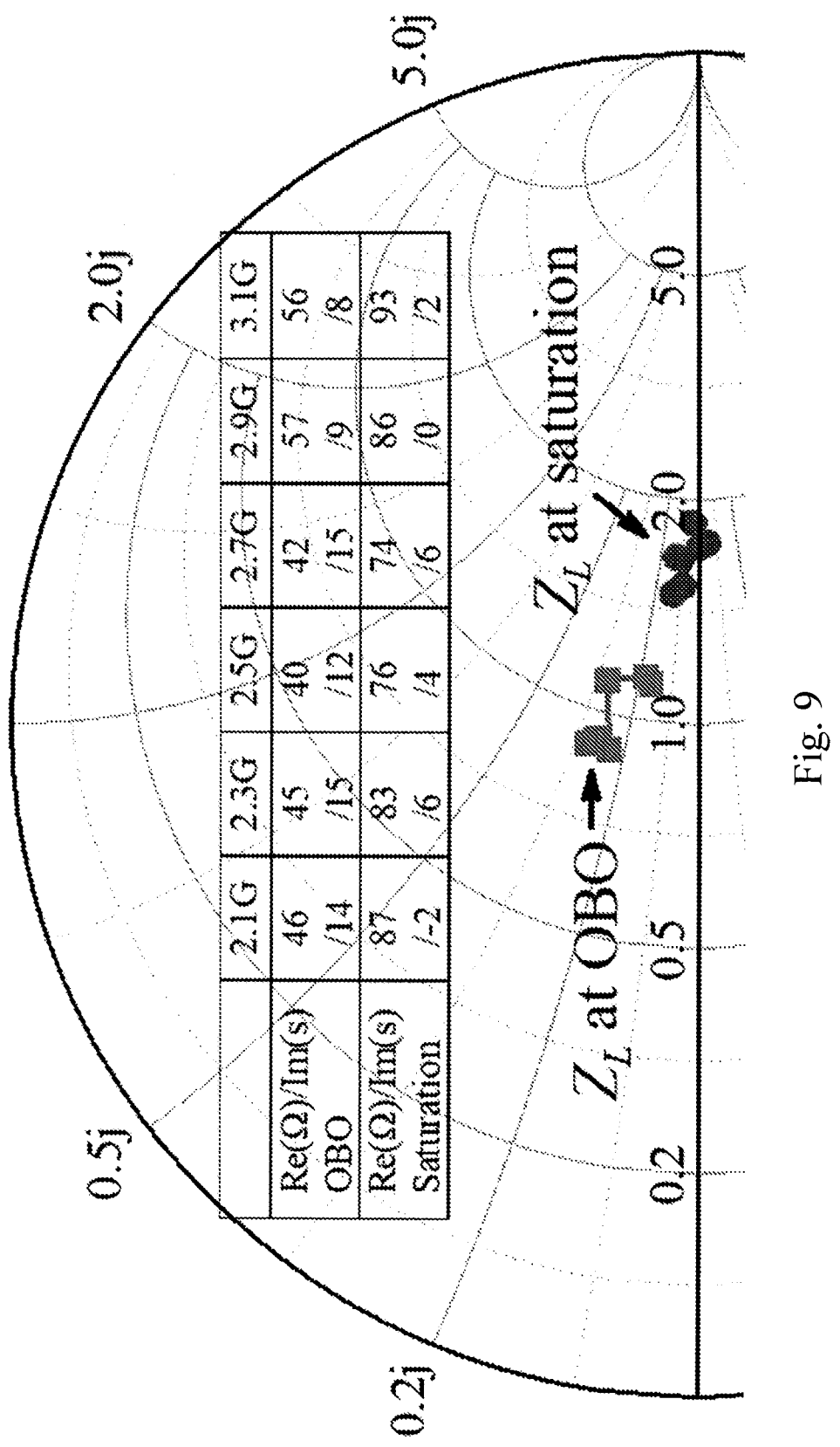
FIG. 9 shows simulated $Z_L$ at OBO and saturated states in the carrier path of the Doherty power amplifier in FIG. 8.
Figure 10A:
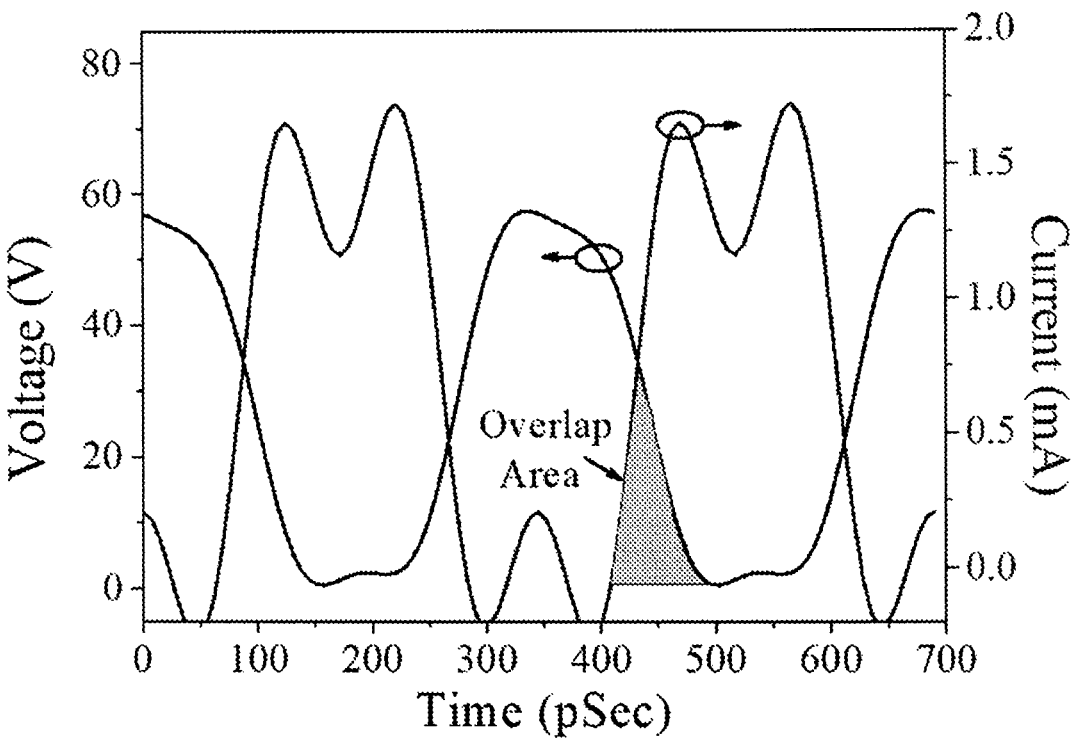
FIG. 10a shows simulated intrinsic voltage and current at saturation of the Doherty power amplifier in FIG. 8 at 2.6 GHz.
Figure 10B:
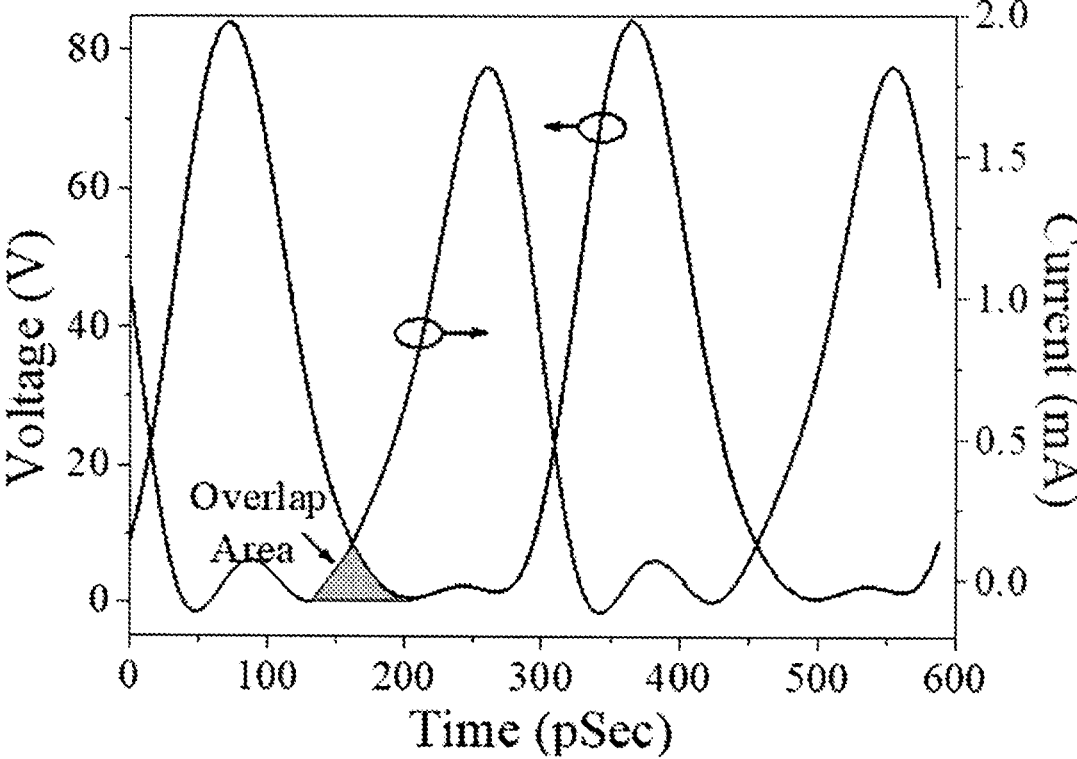
FIG. 10b shows simulated intrinsic voltage and current at saturation of the Doherty power amplifier in FIG. 8 at 3 GHz.
Figures 11, 12A:
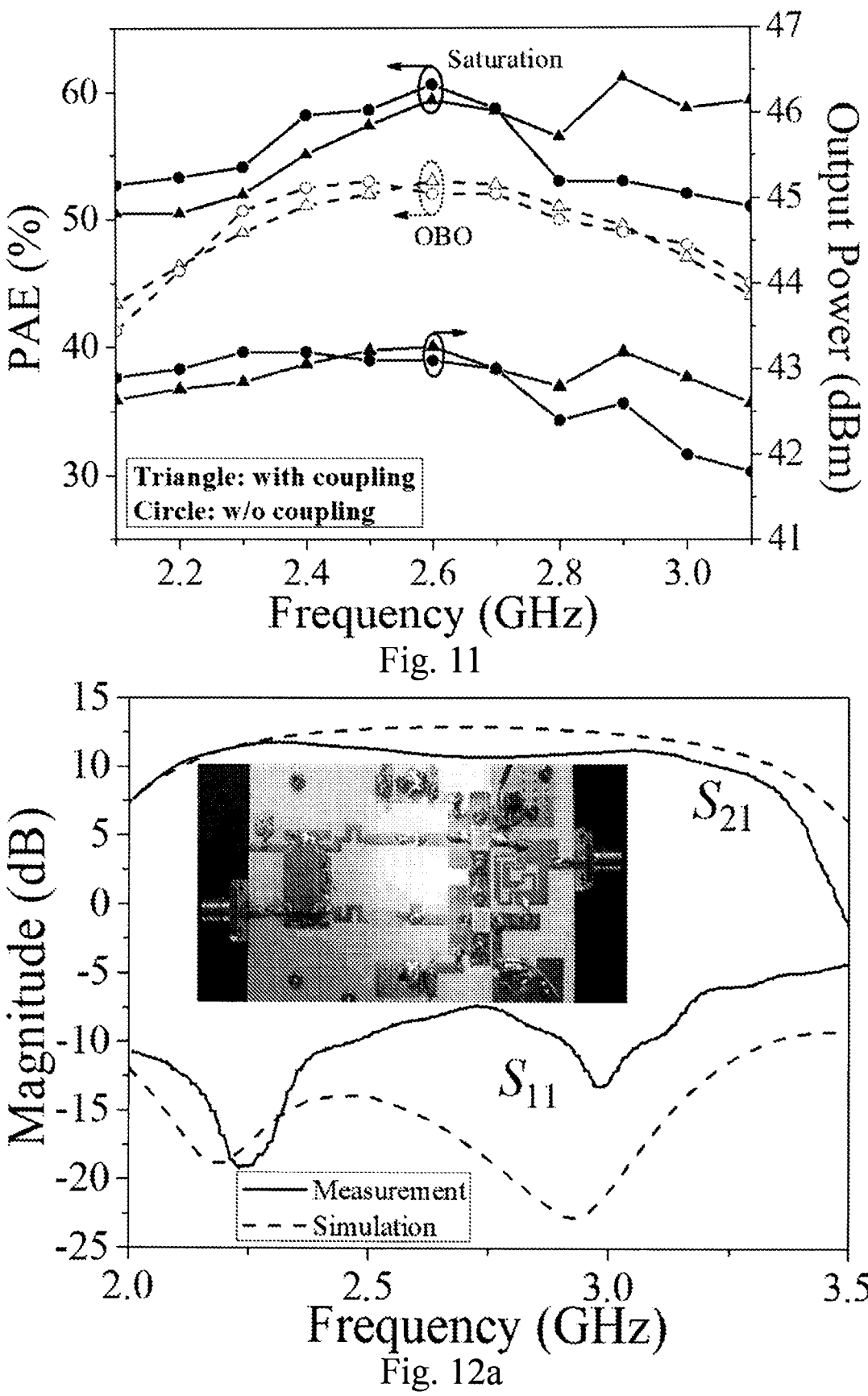
FIG. 11 illustrates simulated performance comparison for whether using harmonic injection in OMNs in the Doherty power amplifier in FIG. 8.
FIG. 12a shows simulated and measured S parameters for the Doherty power amplifier in FIG. 8.

In an experimental setup based on a prototype (see the insert of FIG. 12a) of the DPA manufactured according to the circuit in FIG. 8, after carrying out load-pull simulations based on Cree CGH40010F GaN HEMT, the load-pull impedance is determined to be $20+3_j$. FIG. 9 shows the simulated $Z_L$, where $X_L$ is small and $R_L$ approaches 50Ω at OBO (100Ω at saturation), resulting in a PMN-free broadband DPA, although the conversion ratio slightly decreases at $f_0$. In this prototype, $2f_n$ is selected at around 6 GHz, and simulated $Z_{sy}$ are all small: 8.3-17j, 1.5-13 j and 3-6$_j$ at 5.8, 6 and 6.2 GHz, respectively. These $2^{nd}$ harmonics are short-circuited by the out-of-phase injection. FIGS. 10a-10b show the intrinsic voltage and current in the carrier path after de-embedding the parasitics of the active device. Current bifurcation in FIG. 10a is caused by harmonics which reshape the waveforms. After introducing the out-of-phase injection, the bifurcation disappears and the voltage rises, as shown in FIG. 10b, implying a higher output power. The current and voltage waveforms show the standard half-sine waveform similar to what one can get for Class-B. The overlapping area is smaller, indicating enhanced efficiency. FIG. 11 shows a performance comparison between with and without using the out-of-phase harmonic injection. The OBO efficiency is similar while the saturated efficiency and output power at high frequency show significant improvements. The performance at low frequency is degraded slightly due to the phase mismatch.

The complete fabricated circuit in the prototype, as shown in the inset of FIG. 12a, operates from 2.1 to 3.1 GHz, and measured results show a 7-8.2 dB gain and 42.2-43.3 dBm output power at saturation. The 6-dB OBO and saturated efficiency is 42.3-52% and 60.4-67.7%, respectively. The area of the whole output matching networks (OMNs) is only 19×37 mm², indicating a significant size reduction, while the DPA's performance is comparable with the PMN types. The whole prototype occupies a small area of 68×48 mm².

In the experimental setup, the DPA is biased with carrier quiescent current of 54 mA and peaking gate DC bias of −6.2

V. The drain supply voltages of both the carrier and peaking devices are 28 V. FIG. 12a shows both simulated and measured S parameters for the prototype. Good agreement can be observed with a slight deviation at high frequency due to parasitic effects of the surface mount components and fabrication tolerance. The measured return losses are better than 7 dB from 2 to 3.2 GHz, while the maximum measured small-signal gain is about 11.7 dB.

Figures 12B, 13A:
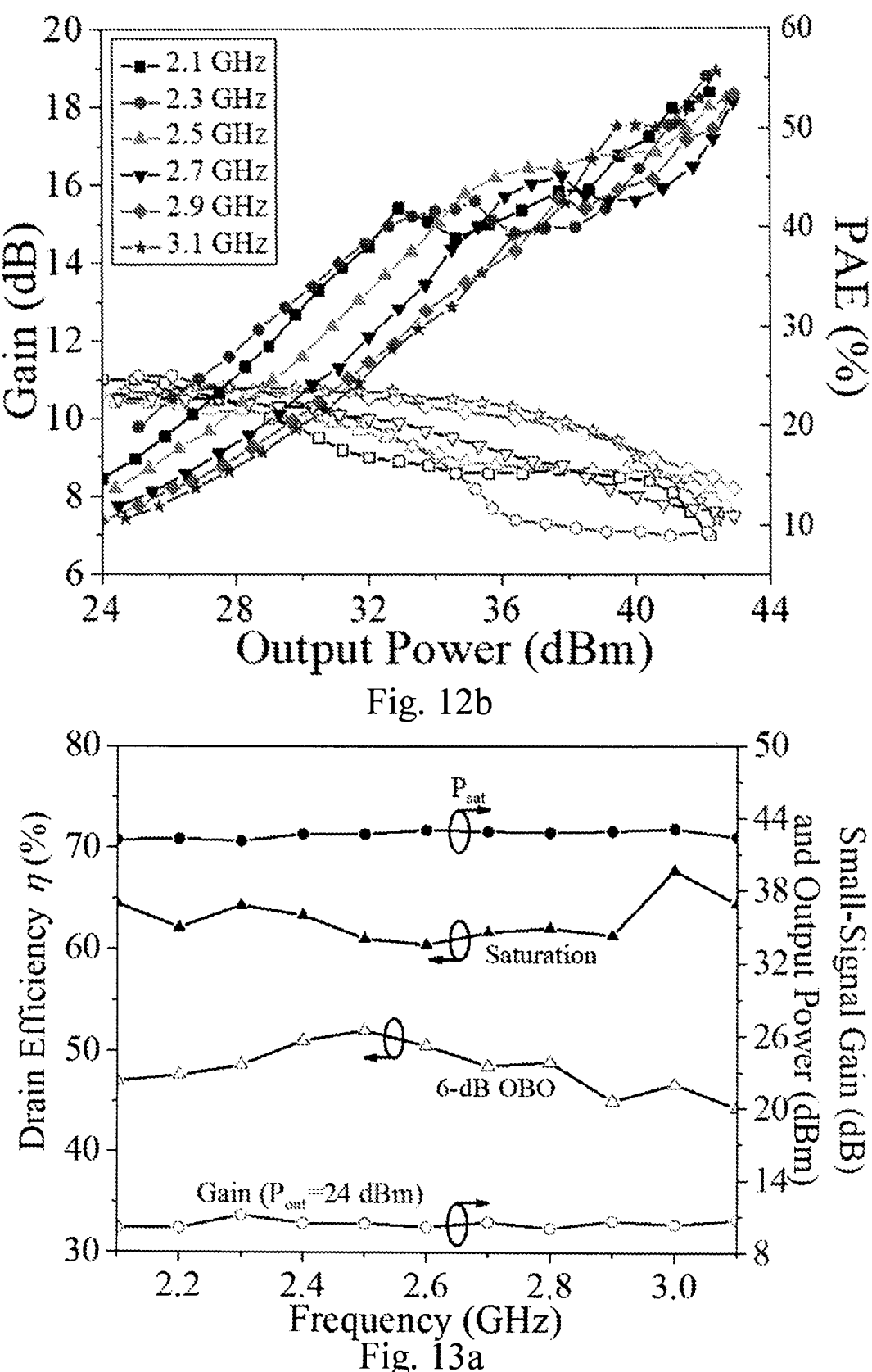
FIG. 12b shows measured large-signal results of the Doherty power amplifier in FIG. 8.
FIG. 13a shows measured drain efficiency and saturation versus frequency for the Doherty power amplifier in FIG. 8.

FIG. 12b shows the measured large-signal results of the prototype. From 2.1 to 3.1 GHz, the PAEs at 6-dB OBO and saturation span from 39.5%-46% and 51.4%-59.3%, respectively. Saturated output powers change from 42.2 dBm to 43.3 dBm. Measured small-signal gain varies slightly from 10-11.1 dB with frequency, and the gain compressions at saturation are less than 3.8 dB. FIG. 13a shows the drain efficiency η at 6-dB OBO and saturation varies from 44.3% to 52% and 60.4% to 67.7%, respectively.

Figure 13B:
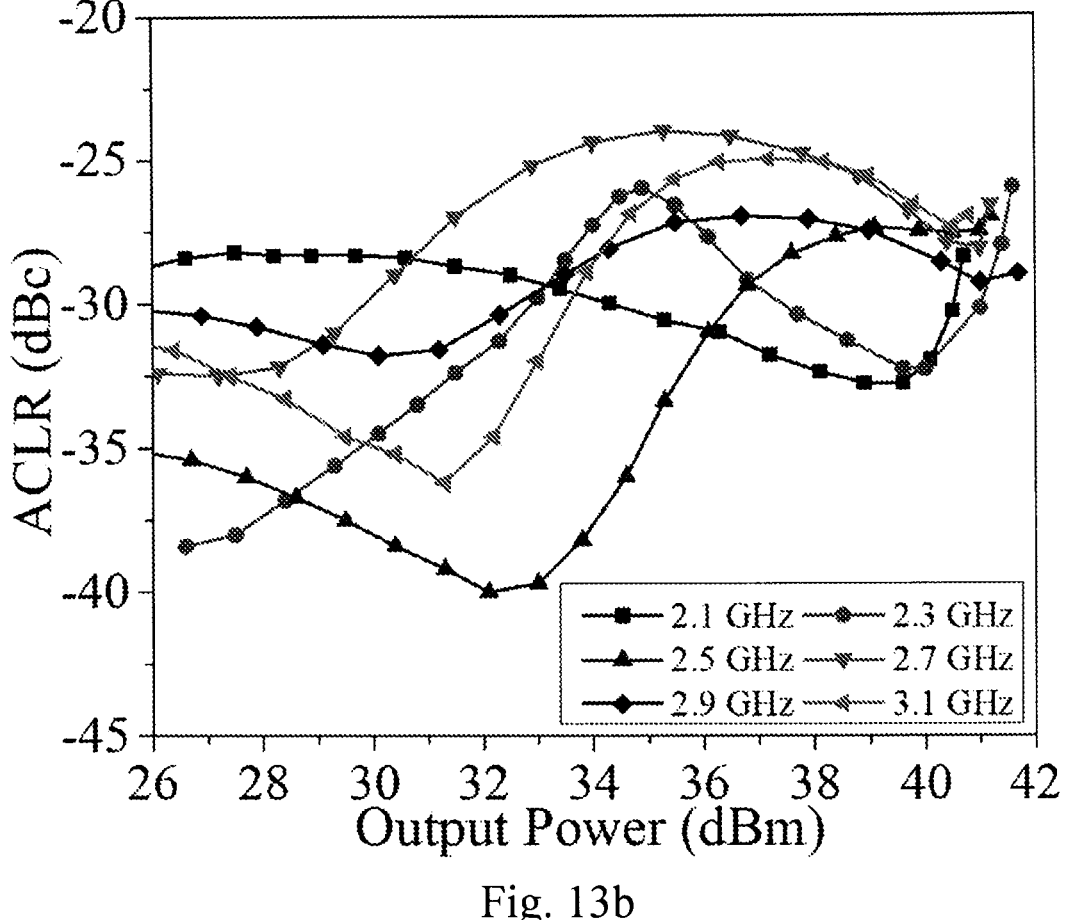
FIG. 13b shows measured lower ACPR performance for different frequencies for the Doherty power amplifier in FIG. 8.

Adjacent channel power ratio (ACPR was measured with a 3.84 MHz channel bandwidth. The measured results are shown in FIG. 13b with only one shown due to symmetry of the ACPR for both lower and upper bands. The lower ACPR performance of the DPA is better than −24 dBc from 2.1 to 3.1 GHz. The bandwidth is around 1 GHz.

A performance comparison between the DPA in FIG. 8 and published state-of-the-art broadband DPAs is summarized in FIG. 14, where most of the prior art DPAs adopt PMNs to expand the bandwidths. F-η is an important power amplifier figure of merit because efficiency and frequency can be jointly evaluated. The performance of the DPA of FIG. 8 (indicated as "T.W" in FIG. 14) is comparable to the traditional post-matching DPAs [7]-[9]. In [10], the OMN before the summing node is omitted and the impedance conversion relies entirely on the PMN, obtaining the broadest bandwidth, but efficiency inevitably degrades. Efficiency in Ref. [11] and [12] and is higher than others, but their bandwidths are only about 0.7 GHz. The BW and efficiency of the DPA are obviously better than the other two PMN-free DPAs such as those in [15] and [16]. The DPA occupies a smallest area, and since it has no post-matching network, the electrical dimension of the output matching network and whole circuit is only 0.26×0.51 and 0.89×0.65

$$\lambda_g^2,$$

respectively.

One can see that the DPA in FIG. 8 contains a broadband OMN that can realize high impedance conversion and harmonic injection. As a result, the DPA possess comparable performance to traditional DPAs. Benefitting from the dual-mode IT, the DPA occupies a very small area due to the removal of the PMN. DPAs according to embodiments of the invention is suitable for the realization of broadband and multi-standard small-cell base stations and is easy to incorporate into on-chip designs. Furthermore, as mentioned above in relation to FIG. 2 the dual-mode IT can be replaced by an equivalent LC circuit, which is convenient when transferring to on-chip designs, where the fabrication cost is also reduced due to the size reduction. These features make it an idea candidate for potential small-cell and femto-cell applications where size and cost are important factors that contribute to it success.

The exemplary embodiments are thus fully described. Although the description referred to particular embodiments, it will be clear to one skilled in the art that the invention may be practiced with variation of these specific details. Hence this invention should not be construed as limited to the embodiments set forth herein.

While the embodiments have been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

It will be appreciated by persons skilled in the art that the expressions "network" or the like are used in the description to refer to a circuit or circuit part, which can be form by any combination of transmission line, transmission line portions, or other active or inactive electronic circuit components. The term "offset line" can also be called an "offset transmission line". The term "main power amplification device", "carrier device", or the like, refers to a "carrier power amplifier" or "carrier amplifier". The term "auxiliary power amplification device", "peaking device", or the like, refers to a "peaking power amplifier" or "peaking amplifier". Unless otherwise specified, the term "connected", "engaged", "coupled with/ to", or the like, may refer to direct or indirect connections, engagement, coupling, etc. The expression "Doherty power amplifier circuit" can be used to refer to a "Doherty power amplifier" or any parts of it.

In FIG. 8, a specific microstrip-line implementation of a DPA according to an embodiment of the invention is shown, but one skilled in the art should understand that the circuit in FIG. 8 is in no way meant to be limiting. The invention may be implemented in many other ways, and not necessarily in the form shown in FIG. 8.

What is claimed is:

1. A Doherty power amplifier comprising:
a) an input;
b) an output;
c) a main power amplification device connected between the input and the output; and
d) an auxiliary power amplification device connected between the input and the output, and arranged in parallel with the main power amplification device;
wherein the Doherty power amplifier further comprises a first dual-mode impedance transformer (IT) connected between the main power amplification device and the output; and a second dual-mode IT between the auxiliary power amplification device and the output; the first and second dual-mode ITs each adapted to convert an input impedance of a corresponding one of the main and auxiliary power amplification devices to a load impedance at the output, at two frequencies simultaneously;
wherein each of the first and second dual-mode ITs comprise a first inductor, a third inductor, and a shunt short-ended stub; the first inductor having a first end connected to an output of a corresponding one of the main and auxiliary power amplification devices; a second end of the first inductor connected to a first end of the shunt short-ended stub and to a first end of the third inductor;
a second end of the shunt short-ended stub being grounded; a second end of the third inductor connected to the output of the Doherty power amplifier.

2. The Doherty power amplifier of claim 1, wherein each of the first and second dual-mode ITs comprises a drain bias that is connected to an output of a corresponding one of the main and auxiliary power amplification devices.

3. The Doherty power amplifier of claim 2, wherein the drain biases each is smaller than $\lambda/4$ at $f_0$.

4. The Doherty power amplifier of claim 1, wherein the input impedances of the first and second dual-mode ITs is designed to be close to the load-pull impedances of the main power amplification device and the auxiliary power amplification device.

5. The Doherty power amplifier of claim 1, wherein the shunt short-ended stubs of the first and second dual-mode ITs form a couple-line bandpass filter.

6. The Doherty power amplifier of claim 5, wherein the couple-line bandpass filter and the first inductors of the main and auxiliary power amplification devices, define an out-of-phase second harmonic injection path.

7. The Doherty power amplifier of claim 1, further comprises a wideband coupler; the wideband coupler connected between the input of the Doherty power amplifier, and the main and auxiliary power amplification devices.

8. The Doherty power amplifier of claim 7, further comprises first stepped-impedance lines connected between the wideband coupler and the main power amplification device; and second stepped-impedance lines connected between the wideband coupler and the auxiliary power amplification device.

9. The Doherty power amplifier of claim 1, wherein the input impedances of the main and auxiliary power amplification devices are complex impedances, and the load impedance is a real impedance.

10. The Doherty power amplifier of claim 1, further comprises a third dual-mode IT connected between the first dual-mode impedance transformer and the output of the Doherty power amplifier; and a fourth dual-mode IT connected between the second dual-mode impedance transformer and the output of the Doherty power amplifier; the first and third dual-mode ITs forming a two-order cascaded structure; the second and fourth dual-mode ITs forming a two-order cascaded structure.

11. The Doherty power amplifier of claim 10, wherein each of the third and fourth dual-mode ITs comprises a shunt short-ended stub.

12. The Doherty power amplifier of claim 11, wherein the shunt short-ended stubs of the third and fourth dual-mode ITs form a couple-line bandpass filter.

13. The Doherty power amplifier of claim 1, wherein the Doherty power amplifier is free of a post-matching network.

* * * * *